United States Patent [19]
Penney et al.

[11] Patent Number: 6,111,811
[45] Date of Patent: Aug. 29, 2000

[54] HIGH-SPEED SYNCHRONOUS OUTPUT DRIVER

[75] Inventors: Daniel Bryan Penney; Thanh Kim Mai, both of Houston; Brian Brown, Sugarland, all of Tex.

[73] Assignee: Texas Instruments Incorporated, Dallas, Tex.

[21] Appl. No.: 09/307,001

[22] Filed: May 7, 1999

Related U.S. Application Data

[60] Provisional application No. 60/084,576, May 7, 1998.

[51] Int. Cl.[7] ........................................... G11C 7/00
[52] U.S. Cl. ...................... 365/233; 365/203; 365/230.06
[58] Field of Search ........................ 365/233, 189.05, 365/230.08, 203, 230.06

[56] References Cited

U.S. PATENT DOCUMENTS 5,986,938  11/1999  Jang ..................................... 365/230.06

Primary Examiner—Terrell W. Fears
Attorney, Agent, or Firm—Robby T. Holland; Carlton H. Hoel; Frederick J. Telecky, Jr.

[57] ABSTRACT

A semiconductor memory emphasizing manipulated clocking and buffering to increase operating speeds.

32 Claims, 4 Drawing Sheets

HIGH-SPEED SYNCHRONOUS OUTPUT DRIVER

This application claims priority under 35 USC §119(e)(1) of provisional application Ser. No. 60/084,576 filed May 7, 1998.

TECHNICAL FIELD

The present invention relates generally to semiconductor devices, and more particularly to output buffer circuits for synchronous semiconductor devices.

BACKGROUND OF THE INVENTION

The increased operating speeds of electronic systems has made synchronous random access memories (RAMs) a preferred device for the storage of data that must be accessed rapidly. Synchronous RAMs operate in synchronism with a system clock. In a typical read operation, an address is latched on the rising edge of the system clock, and memory cells are selected according to the address. The selected memory cell data is then coupled to a data output path and finally driven on output pins for use by the system. Synchronous RAMs can be particularly effective in "burst" modes, in which the data of consecutive addresses is driven on output pins on consecutive clock cycles.

The minimum delay between the application of an address and the availability of output data will determine the maximum read operating speed of a synchronous RAM. Thus, reducing the delay required to provide output data allows for a faster, and hence a more desirable memory device. In addition, due to the data bandwidth advantages of burst mode, the ability to provide rapid bursts of data is also highly desirable.

The last portion of a data output path is usually the circuit that physically drives a data output pin. Such circuits are commonly referred to as output drivers or buffers. Referring now FIG. 1, a portion of a prior art output driver is set forth in a schematic diagram and designated by the general reference character 100. The output driver 100 drives an output node 102 between a first logic level and a second logic level by coupling the output node 102 to a high power supply voltage VDD or low power supply voltage VSS, respectively. The prior art output driver 100 is shown to include a p-channel metal-oxide-semiconductor (MOS) high drive transistor P100 having a source-drain path coupled between the output node 102 and the VDD voltage. In addition, an n-channel MOS low driver transistor N100 has a source-drain path coupled between the output node 102 and the VSS voltage. The high or low drive transistor (P100 or N100) is activated to couple the output node 102 to the VDD or VSS voltage, respectively.

The operation of transistor P100 is controlled by a high pre-drive circuit, shown in FIG. 1 as 104. The high pre-drive circuit 104 includes a p-channel MOS transistor P102 in series with an n-channel MOS transistor N102. The common drains of transistors P102 and N102 are coupled to the gate of high drive transistor P100. In a similar fashion, the operation of transistor N100 is controlled by a low pre-drive circuit 106, which includes series connected p-channel MOS transistor P104 and n-channel MOS transistor N104. The common drains of transistors P104 and N104 are coupled to the gate of low driver transistor N100. The gate connection of transistor P100 to its respective pre-drive circuit is shown as charge control node 108. The gate connection of transistor N100 to its respective pre-drive circuit is shown as discharge control node 110.

It is noted that in order to be able to rapidly drive the relatively high resistive and capacitive load presented by an output pin, the high drive transistor P100 and low drive transistor N100 are typically very large devices. As a result, the gates of transistors P100 and N100 present a relatively large capacitance to their respective pre-drive circuits (104 and 106). Thus, the speed with which the drive transistors (P100 and N100) can be turned on and off (and hence the speed at which data can be driven on the output node 102) depends upon the speed at which the high pre-drive circuit 104 and low pre-drive circuit 106 can change the voltage at the charge and discharge control nodes (108 and 110), respectively. Because of this, transistors P102, N102, P104 and N104, while not as big as the very large driver transistors P100 and N100, can be large devices relative to other transistors of the synchronous RAM.

The high drive control circuit 104 is shown to receive a hidrvoff_ signal, which is low when high drive device P100 is turned off, and hidrvon signal, which is high when the high drive device is to be turned on. The timing and generation of the hidrvoff_ and hidrvon signals can impact the speed of the output driver 100. In the same manner, the low drive control circuit 106 timing is controlled by a lodrivon_ signal and lodrvoff signal. The hidrvoff_, hidrvon, lodrivon_, and lodrvoff are generally synchronous with the system clock signal.

In addition to fast operating speeds, the power consumption of a synchronous RAM is an important feature. While high output buffer operating speeds can be achieved by using large transistors, the switching of such large devices, and those devices which generate control signals (such as the hidrvoff_, hidrvon, lodrivon_, and lodrvoff signals), can result in relatively high current consumption. Due to the multiple number of output buffers on a synchronous device, the resulting power consumption can be considerable.

Due to the considerable impact an output buffer can have on the operating speed of a synchronous device, there is always a need for fast synchronous output buffer circuits. At the same time, it is also desirable to include output buffer circuits that do not consume relatively large amounts of power.

SUMMARY OF THE INVENTION

According to the preferred embodiment, an output buffer includes a relatively large first drive transistor device and a relatively large second drive device coupled to an output node. The gate of the first drive transistor is driven by a high pre-drive circuit. The high pre-drive circuit includes a group of relatively large discharge transistors for discharging the gate of the first drive transistor, and a group of relatively large charge transistors for charging the gate of the first drive transistor. In response to a high clock level, either the discharge transistors or charge transistors are activated, depending upon the value of an input data signal. In response to a low clock level, the charge transistors are disabled by relatively small disable transistors. In a similar fashion, the gate of the second drive transistor is driven by a low pre-drive circuit having relatively large charge transistors that are disabled by relatively small disable transistors, when the clock signal is low.

DETAILED DESCRIPTION OF THE EMBODIMENTS

The preferred embodiment is an output buffer that may be utilized in a synchronous semiconductor device, such as a synchronous random access memory (RAM). The preferred embodiment drives an output node in response to input data and control signals that are synchronous with a system clock signal. The preferred embodiment provides rapid and relatively low power performance by using smaller devices to turn off larger pre-drive transistors.

Figure 1:
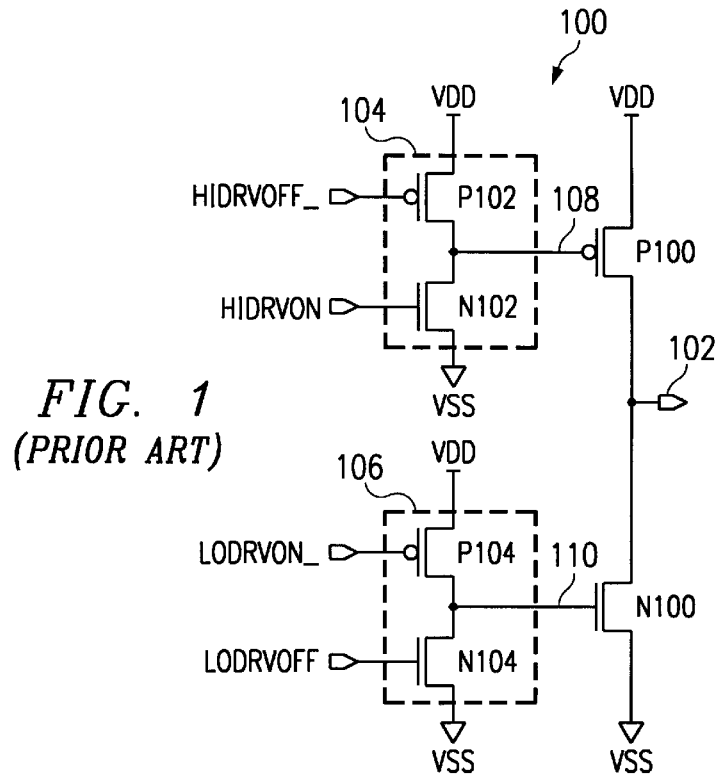
FIG. 1 is a schematic diagram of a prior art output buffer circuit.
Figure 2A:
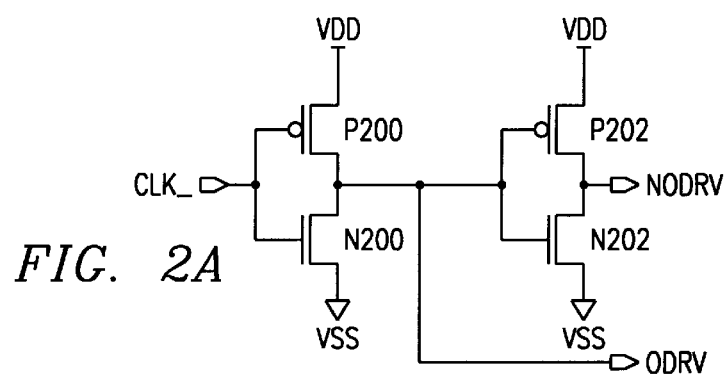
FIGS. 2A–2C are schematic diagrams illustrating the generation of various control signals utilized in the preferred embodiment.
Figure 2B:
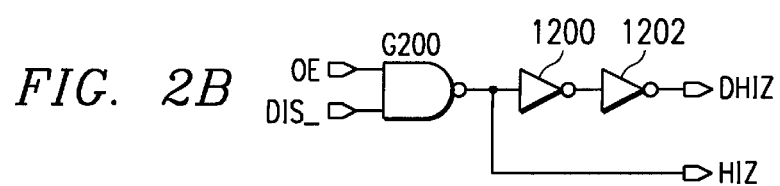
Figure 2C:
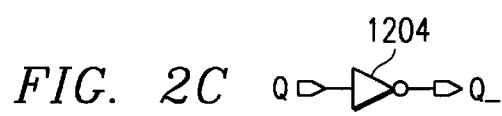

Referring now to FIGS. 2A–2C, three timing circuit are set forth, illustrating the generation of various control signals that are utilized in the preferred embodiment. FIG. 2A sets forth a clock buffer circuit for providing timing signals that are synchronous with a system clock signal. The inverse of the system clock signal is shown as CLK_, and is coupled to the input of a first inverter formed by p-channel metal (conductor)oxide(insulator)-semiconductor (MOS) transistor P200 and n-channel MOS transistor N200. The output of the first inverter, formed at the common drains of transistors P200 and N200, provides an output drive signal shown as "odrv." The odrv signal is provided as an input to a second inverter, formed by p-channel MOS transistor P202 and n-channel MOS transistor N202. The output of the second inverter, taken at the common drains of transistors P202 and N202, is an inverse output drive signal, shown as "nodrv."

FIG. 2B illustrates the generation of output enable control signal. In addition to driving an output node according to a data value, the preferred embodiment can be placed in a high impedance (high "Z") state by an output enable signal. The circuit of FIG. 2B includes a two-input NAND gate G200 which receives an output enable signal, shown as OE and a disable signal, shown as DIS_. The output of gate G200 provides a high impedance control signal, shown as "hiz." The hiz signal is further coupled through two series connected inverters (I200 and I202) to generate a delayed high impedance control signal, shown as "dhiz." In this arrangement, provided the DIS_ signal is high, the hiz signal will be the inverse of the OE signal, and the dhiz signal will be a delayed version of the hiz signal. When the DIS_ signal is low, the hiz signal and dhiz signal will be forced high.

FIG. 2C simply illustrates the generation of an inverse data signal. The data signal received by the preferred embodiment is shown as "q." The q signal is inverted by an inverter I204 to generate a "q_" signal.

Figure 3:
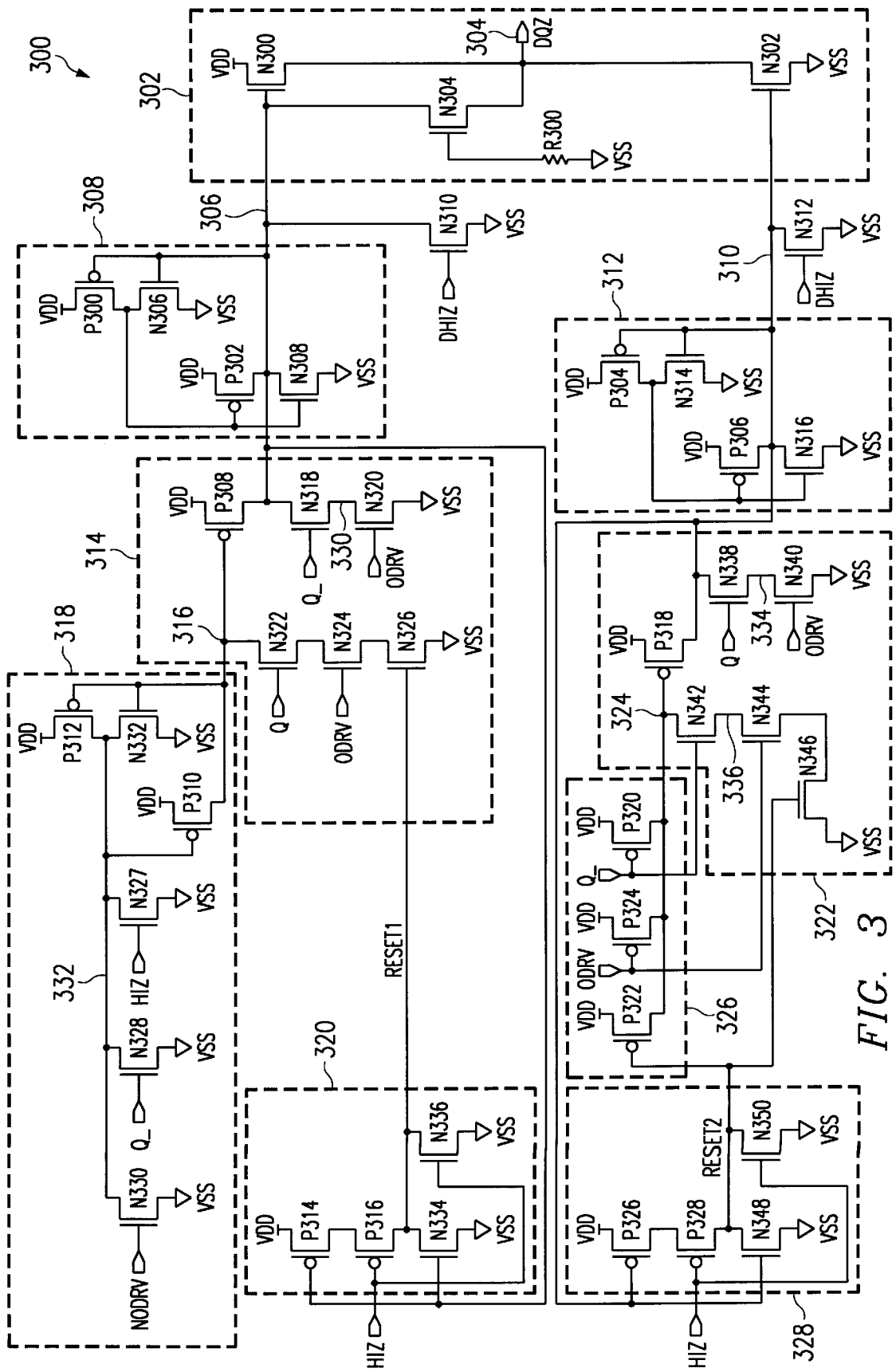
FIG. 3 is a schematic diagram of the preferred embodiment.

Having described those circuits used for generating the various control signals for the preferred embodiment, the preferred embodiment will now be described in detail. Referring now to FIG. 3, the preferred embodiment is set forth in detailed schematic diagram, and designated by the general reference character 300. The preferred embodiment 300 is shown to include a driver section 302, that includes a high drive n-channel MOS transistor N300, a low drive n-channel MOS transistor, and a clamping device N304. The high drive transistor N300 and low drive transistor N302 have source-drain paths coupled in series between the high power'supply voltage VDD and the low power supply voltage VSS. An output node 304 is formed at the source-drain junction of transistors N300 and N302. The signal provided by the output node 304 is shown as "dqz" in FIG. 3.

The clamping device N304 is an n-channel MOS transistor with its source-drain path coupled between the gate of transistor N300 and the output node 304. The gate of clamping device N304 is coupled to the low power supply voltage by a resistor R300. Clamping device N304 ensures that transistor N300 will remain off in the event the potential at the output node 304 falls below the low power supply voltage.

In the preferred embodiment 300, the high and low drive transistors (N300 and N302) are large devices, with transistor N300 having a width-to-length ratio (W/L) of 900/1.2 and transistor N302 having a W/L of 600/1.2. Clamping device N304 has a W/L of 180/1, and resistor R300 has a value of 10,000 ohms.

The gate of high drive transistor N300 is coupled to a high drive node 306. Thus, when the high drive node 306 is high, the output node 304 will be driven to a high voltage. When the high drive node 306 is low, high drive transistor N300 will be turned off, allowing the output node 304 to driven to a low voltage or float in a high impedance state. A first latch circuit 308 is coupled to the high drive node 306. The first latch circuit 308 includes an input inverter, formed by p-channel MOS transistor P300 and an n-channel MOS transistor N306, in series with a second inverter, formed by p-channel MOS transistor P302 and n-channel MOS transistor N308. Transistors P300 and N306 have a common gate coupled to the high drive node 306, and transistors P302 and N308 have a common drain coupled to the high drive node 306. With this arrangement, when the high drive node 306 is driven to high or low potential, the first latch circuit 308 will latch the high drive node 306 at that value.

In the preferred embodiment 300, transistors P300 and N306 have W/Ls of 9/1.1 and 3/1.1, respectively. Transistors P302 and N308 have W/Ls of 15/1.1 and 5/1.1, respectively.

In addition to the first latch 308, a first disable transistor N310 is coupled to the high drive node 306. Disable transistor is an n-channel MOS transistor having a source-drain path coupled between the high drive node 306 and the low power supply voltage VSS. The gate of transistor N310 receives the dhiz signal. Thus, when the dhiz signal is low, transistor N310 is off, and has no substantial effect on the function of the output buffer 300. However, when the dhiz signal is high, the high drive node 306 will be pulled low, disabling the high drive transistor N300. The first drive transistor N310 is relatively large, having a W/L of 100/1.1. This enables transistor N310 to pull the high drive node 306 low at a relatively rapid speed.

The gate of low drive transistor N302 is coupled to a low drive node 310. When the low drive node 310 is high, low drive transistor N302 is turned on, coupling the output node 304 to a low voltage. When node 310 is low, transistor N302 is turned off, allowing the output node 304 to be driven high or held at a high impedance state.

A second latch 312 and second disable transistor N312 are coupled to low drive node 310 in the same fashion as the first latch 308 and first disable transistor N310 are coupled to the high drive node. The gate of transistor N312 receives the dhiz signal. Thus, when dhiz signal is high, both drive transistors (N300 and N302) are turned off, and the output node 304 is held in a high impedance state.

In the preferred embodiment 300, transistor N312 has a W/L of 50/1. In addition, a first inverter within the second latch 312 includes p-channel transistor P304 and n-channel transistor N314 having W/Ls of 6/1 and 3/1, respectively. A second inverter within the second latch 312 includes p-channel transistor P306 and n-channel transistor N316 having W/Ls of 10/1 and 3/1, respectively.

The high drive node 306 is driven between a high and low voltage by a high pre-drive circuit 314. The high pre-drive circuit 314 is shown to include a discharge group that includes a data controlled n-channel MOS transistor N318 and clocked n-channel MOS transistor N320. Transistors N318 and N320 have source-drain paths in series between the high drive node 306 and the low power supply voltage. The gate of transistor N318 receives the data inverse value q_ and the gate of transistor N320 receives the output drive signal odrv (which is synchronous with the system clock signal CLKX).

The high pre-drive circuit 314 also includes a charge group with a p-channel MOS transistor P308, and three n-channel MOS transistors shown as N322, N324 and N326. Transistor P308 has a source-drain path coupled between the high drive node 306 and the high power supply voltage VDD. The gate of transistor P308 is coupled to the low power supply voltage VSS by the series connected source-drain paths of transistors N322, N324 and N326. The gate of transistor N322 is driven by data signal q, the gate of transistor N324 is driven by the signal odrv, and the gate of transistor N326 is driven by a first reset signal "reset1." Within the high pre-drive circuit 314, the discharge group (N318 and N320) and charge group (P308, N322, N324 and N326) operate in a complementary fashion. When the data signal q is high, the discharge group is disabled as transistor N318 is turned off. In contrast, the charge group is enabled, and when the odrv signal transitions high, the gate of transistor P308 will be pulled low, turning on transistor P308 and charging the high drive node 306. Because the potential at the gate of transistor P308 controls the charging action of the pre-drive control circuit 314, the connection between the gate of transistor P308 and the drain of transistor N322 can be considered a first pre-drive control node 316.

An alternate way of conceptualizing the high pre-drive circuit 314 is to consider transistor P308 to be a charge device, as it charges the high drive node 306, and to consider transistors N322, N324 and N326 as charge enable devices, as they activate the charge device when enabled.

In the preferred embodiment 300, the devices within the high pre-drive circuit 314 are relatively large, to enable rapid charging and discharging of the high drive node 306. The W/Ls of transistors N318, N320, P308, N322, N324 and N326 are 310/1.1, 225/1, 310/1.1, 150/1.1, 110/1 and 110/1, respectively.

The pre-drive control node 316 can be driven to a disabling (high) potential by a first disable circuit 318. The first disable circuit 318 includes a p-channel MOS pull-up device P310, having a source-drain path coupled between the pre-drive control node 316 and the high power supply voltage VDD. The gate of transistor P310 is coupled to the low power supply voltage VSS by three n-channel MOS transistors, N327, N328 and N330, arranged in parallel. The gate of transistor N327 receives the hiz signal, the gate of transistor N328 receives the q_ signal, and the gate of transistor N330 receives the nodrv signal. In addition, the first disable circuit 318 further includes a feedback inverter coupled between the pre-drive control node 316 and the gate of transistor P310.

In the event transistor P310 is turned on, transistor P308 within the high pre-drive circuit 314 is turned off, preventing the high drive node 306 from being driven high. Thus, if the nodrv signal, q_ signal or hiz signal are high, the charging capability of the buffer circuit 300 is disabled by the first disable circuit 318.

In the preferred embodiment 300, the devices within the first disable circuit 318 are small, relative to the devices of the high pre-drive circuit 314. The sizing of transistors P310, N327, N328, N330, P312 and N332 are 15/1.1, 15/1.1, 15/1.1, 15/1.1, 3/1.1 and 3/1.1, respectively.

The reset signal reset1, which drives the gate of transistor N326 within the high pre-drive circuit 314, is generated by a first reset circuit 320. The first reset circuit 320 is essentially a complementary MOS (CMOS) NOR gate, having a first input which receives the hiz signal, and a second input coupled to the high drive node 306. The first reset circuit 320 includes two p-channel MOS transistors (P314 and P316) arranged in series, and two n-channel MOS transistors (N334 and N336) arranged in parallel. The gates of transistors P314 and N334 are coupled to the high drive node 306, and the gates of transistors P316 and N336 receive the hiz signal. In the preferred embodiment 300, the sizing of transistors P314, P316, N334 and N336 are 10/1.1, 10/1, 5/1.1 and 10/1.

The low drive node 310 is driven between a high and low voltage by a low pre-drive circuit 322. The low pre-drive circuit 322, like the high pre-drive circuit 314, includes a discharge group and a charge group. The discharge group includes a data controlled n-channel MOS transistor N338 and clocked n-channel MOS transistor N340, coupled in series between the low drive node 310 and the low power supply voltage VSS. The gate of transistor N338 receives the q signal, and the gate of transistor N340 receives the odrv signal. The charge group includes a p-channel MOS transistor P318, and three n-channel MOS transistors N342, N344 and N346 coupled in series between the gate of transistor P318 and the low power supply voltage VSS. The gate of transistor N342 is driven by data signal q_, the gate of transistor N344 is driven by the odrv signal, and the gate of transistor N346 is driven by a second reset signal "reset2."

In a similar fashion to the high pre-drive circuit 314, the discharge group (N338 and N340) and charge group (P318, N342, N344 and N346) operate in a complementary fashion. When enabled by a high q and odrv signal, the discharge group pulls the low drive node 310 low, turning off low drive transistor N302. In contrast, when enabled by a high q_ signal, a high odrv signal, and a high reset2 signal, the charge group turns on transistor P318, pulling the low drive node 310 high. This turns on low drive transistor N302. Because the potential at the gate of transistor P318 controls the charging action of the low pre-drive circuit 322, the connection between the gate of transistor P318 and the drain of transistor N342 can be considered a second pre-drive control node 324.

An alternate way of conceptualizing the low pre-drive circuit 322 is to consider transistor P318 to be a charge device, as it charges the low drive node 310, and to consider transistors N342, N344 and N346 as charge enable devices, as they activate the charge device when enabled.

The devices within the low pre-drive circuit 322 are relatively large to enable rapid charging and discharging of the low drive node 310. The W/Ls of transistors N338, N340, P318, N342, N344 and N346 are 150/1, 150/1, 150/1, 40/1, 40/1 and 40/1, respectively.

The second pre-drive control node 324 is driven to a disabling (high) potential by a second disable circuit 326. The second disable circuit 326 includes three p-channel MOS pull-up devices P320, P322 and P324, arranged in parallel between the pre-drive control node 324 and the high power supply voltage VDD. The gate of transistor P320 receives the q_ signal, the gate of transistor P322 receives the reset2 signal, and the gate of transistor P324 receives the odrv signal. In the event any of the transistors P320, P322 and P324 are turned on, transistor P318 within the low pre-drive circuit 322 will be turned off, preventing the low drive node 310 from being driven high. In this manner, when the odrv signal, reset2 signal or q_ signal are low, the discharging capability of the buffer circuit 300 will be disabled by the second disable circuit 326.

In the preferred embodiment 300, like the first disable circuit 318, the devices of the second disable circuit 326 are relatively small. Transistors P320, P322 and P324 have W/Ls of 5/1, 25/1 and 25/1, respectively.

The reset2 signal is generated by a second reset circuit 328. The second reset circuit 328 is arranged as a CMOS NOR gate having one input that receives the hiz signal, and a second input that is coupled to the low drive node 310. The output of the NOR gate is the reset2 signal. Included within the second reset circuit 328 are two p-channel MOS transistors (P326 and P328) arranged in series, and two n-channel MOS transistors (N348 and N350) arranged in parallel. The gates of transistors P326 and N348 are coupled to the low drive node 310, and the gates of transistors P328 and N350 receive the hiz signal. In the preferred embodiment 300, the sizing of transistors P326, P328, N348 and N350 are 10/1, 10/1, 3/1 and 10/1.

It is noted that the preferred embodiment 300 can be conceptualized as including two portions, a first portion that includes those circuits involved in driving the high drive node 306, and a second portion that includes those circuits involved in driving the low drive node 310. The first portion thus can be considered to include the first latch circuit 308, the first disable transistor N310, the high pre-drive circuit 314, the first disable circuit 318, and the first reset circuit 320. Similarly, the second portion can be considered to include the second latch circuit 312, the second disable transistor N312, the low pre-drive circuit 322, the second disable circuit 326, and the second reset circuit 328.

To assist in the description of the preferred embodiment 300, various nodes are further identified within the first portion and second portion. Therefore, it is noted that FIG. 3 further sets forth a first clocked discharge node 330, shown at the source-drain junction of transistors N318 and N320, and a trigger node 332, shown at the junction of the gate of transistor P310 and the common drains of transistors P312, N330, N328, N327 and N332. Along these same lines, within the second portion, FIG. 3 further identifies a second clocked discharge node 334 at the source-drain junction of transistors N338 and N340, and a clocked charge node 336 at the source-drain junction of transistors N342 and N344.

Having described the general circuit sections of the preferred embodiment 300, the operation of the preferred embodiment 300 will now be described in conjunction with timing diagrams set forth in FIGS. 4A and 4B. The timing diagrams set forth the timing control signals and data signals received by the preferred embodiment. Thus, both FIGS. 4A and 4B set forth waveforms for the system clock signal CLK. the output enable signal OE, the output drive signal odrv (and its inverse nodrv), the high impedance signal hiz, and the delayed high impedance signal dhiz. In addition, the data signal q, its inverse q_, and the resulting output signal dqz, are also set forth in FIGS. 4A and 4B.

Figure 4A:
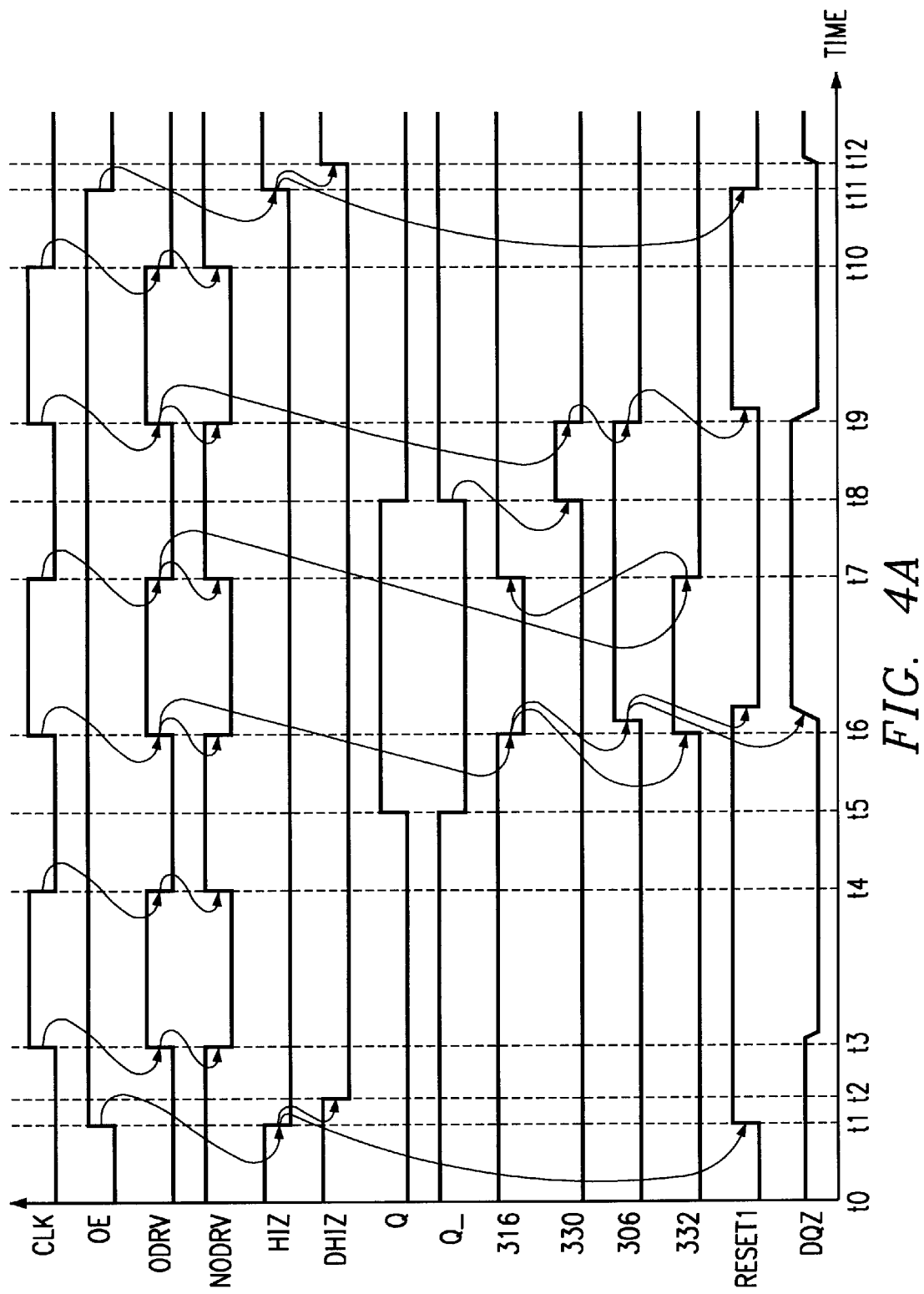
FIGS. 4A and 4B are timing diagrams illustrating the operation of the preferred embodiment set forth in FIG. 3.
Figure 4B:
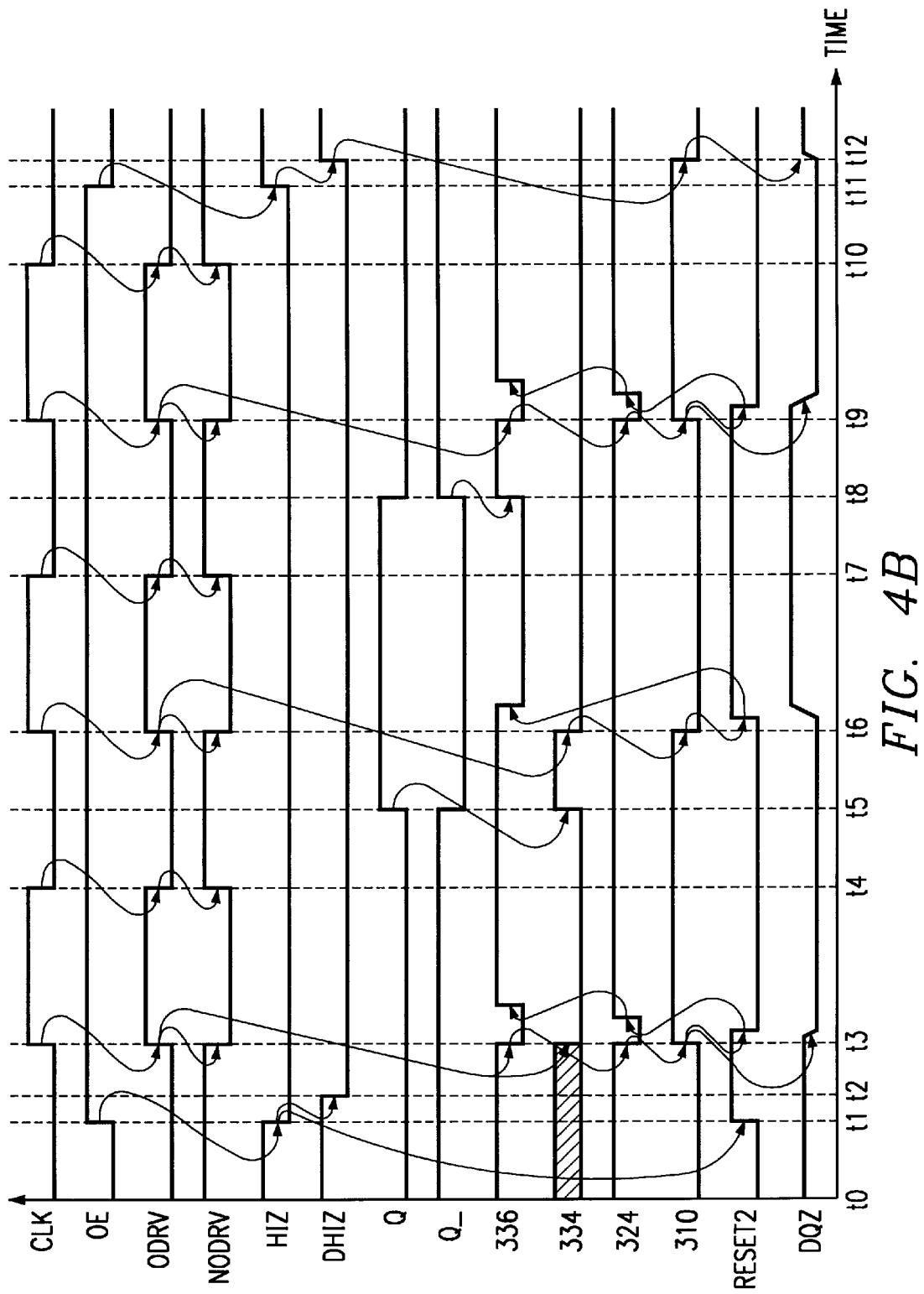

If reference is made to FIG. 3 in conjunction with FIG. 4A, it is shown that FIG. 4A sets forth the response of the first portion of the preferred embodiment 300 (the circuit sections that control the charging and discharging of the high drive node 306). In addition to the various timing control and data signals, FIG. 4A also includes the responses of nodes 316, 330, 306, 332 and the reset1 signal. Similarly, if reference is made to FIG. 3 in conjunction with FIG. 4B, it is shown that FIG. 4B illustrates the response of the second portion of the preferred embodiment 300 (the circuit sections that control the charging and discharging of the low drive node 310). FIG. 4B illustrates the response of nodes 336, 334, 324, 310 and the reset2 signal.

Referring now to FIG. 3 in conjunction with FIGS. 4A and 4B, the synchronous operation of the preferred embodiment 300 will be described.

At time t0, the CLK signal is low, the OE signal is low, and the input data value q is low. The low value of the OE signal results in the preferred embodiment 300 being placed in the disabled state. The low OE value signal generates high hiz and dhiz signals. With dhiz high the first and second disable transistors N310 and N312 are enabled, pulling the high drive node 306 and low drive node 310 to VSS. The nodes 306 and 310 are latched at this low value by first and second latches 308 and 312, turning off high drive transistor N300 and low drive transistor N302. In this manner, the output node 304 is maintained at a high impedance state.

Also at time t0, the high hiz value turns on transistor N327 within the first disable circuit, maintaining the trigger node 332 at VSS. This turns on transistor P310, which drives the first pre-drive control node 316 to the high level. Feedback inverter P312/N332 helps to maintain node 316 high. With node 316 high, transistor P308 within the high pre-drive circuit 314 is turned off, preventing high drive node 306 from being driven high. It is noted that the relatively small device P310 turns off the relatively large device P308. In addition, with transistor P308 turned off, transistors N318 and N320 can more rapidly discharge the high drive node 306.

The high hiz signal also disables the charge group within the low pre-drive circuit 322. The hiz value results in transistor P328 being turned off and transistor N350 being turned on, forcing the reset2 signal low. The low reset2 signal turns on transistor P322, pulling the second pre-drive control node 324 high. With node 324 high, transistor P318 is turned off. As in the case of the high pre-drive circuit 314, with transistor P318 turned off, transistors N338 and N340 do not have to "fight" transistor P318 to discharge the low drive node 306, resulting in rapid, low power discharge operations.

In this manner, the low OE signal results in the node charging capabilities of the high pie-drive circuit 314 and low pre-drive circuit 322 being disabled.

At time t1, the CLK signal is still low, but the OE signal goes high. It is assumed that the DIS_ signal is high at this time, thus, by operation of the circuit set forth in FIG. 2B, the high going OE signal results in the hiz being driven low. Within the first disable circuit 318 transistor N327 turns off. However, at time t1 the nodrv signal is high and the q_ signal is high, keeping transistors N330 and N328 on, and maintaining the trigger node 332 low. With node 332 low, transistor P310 remains turned on, keeping charge transistor P308 turned off.

In addition, the low hiz value turns off transistor N336 and turns on transistor P316 within the first reset circuit 320. Because the high drive node 306 is maintained low by transistor N310 and first latch 308, transistor P314 is on. Thus, the turning on of transistor P316 pulls the reset1 signal high. With the reset1 signal high, transistor N326 within the high pre-drive circuit 314 is turned on. Because of the q and odrv signal values, transistors N322 and N324 remain turned off. It is noted that the devices within the first reset circuit 320 are relatively small, thus the switching therein consumes relatively small amounts of current.

In a similar response to that of the first reset circuit 320, the hiz value turns off transistor N350 and turns on transistor P328 within the second reset circuit 328. Because the low drive node 310 is maintained low by transistors N312 and second latch 312, transistor P326 is on. Thus, when transistor P328 is turned on, the reset2 signal is driven high, turning off transistor P322. However, the low odrv value keeps transistor P324 on, maintaining node 324 at a high logic level. The high reset2 signal turns on transistor N346. As in the case of the first reset circuit 320, the devices of the second reset circuit 328 are relatively small, and thus consume relatively small amounts of current.

At time t2, the low-going transition of the hiz signal propagates through the circuit shown in FIG. 2B, resulting in the dhiz signal transitioning low. With dhiz low, transistors N310 and N312 are turned off. At this point, the high drive node 306 and low drive node 308 are maintained low only by the relatively small devices of the first and second latches (308 and 312).

At time t3 the CLK signal transitions high. In response, the odrv signal transitions high, and the nodrv signal transitions low. Transistor N330 within the first disable circuit is turned off. However, because q remains low, transistor N328 remains turned on, resulting in the first pre-drive control node 316 being maintained at the disable (high) voltage. Within the high pre-drive circuit 314, the high odrv signal results in transistor N320 within the discharge group, being turned on, and transistor N324 within the charge group being turned on. Due to the data value of the q signal, transistor N322 remains off, disabling the charge group (P308, N322, N324 and N326). In contrast, because the q signal is high, the turning on of transistor N320 enables the discharge group (N320 an N318), and the first clocked discharge node 330 and high drive node 306 to be pulled to VSS. It is noted that transistors N320 and N318 are relatively large devices, and thus can provide for rapid discharge of the high drive node 306. However, because the preferred embodiment 300 was previously in the high-z state, the high drive node 306 was already low, and the enabling of the charge group (N320 and N318) has no substantial effect on the dqz output, as drive transistor N300 was already off.

Within the first disable circuit 318 the low nodrv signal transition turns off transistor N330. However, because the signal q_ is high, the trigger node 332 is maintained at a low logic level.

At the same time, the low pre-drive circuit 322 is enabled in a complementary fashion to the high pre-drive circuit 314. The high odrv signal turns on transistor N340 of the discharge group (N340 and N338). Due to the low q signal, although the second clocked discharge node 334 is coupled to VSS, transistor N338 remains off, and the discharge group (N340 and N338) remains disabled. In contrast, the charge group (P318, N342, N344 and N346) is enabled. The high odrv signal turns off transistor P324 and turns on transistor N344. Due to the q_ value and reset2 signal, transistors P320 and P322 are already turned off, and transistors N342 and N346 are already turned on. Thus, the clocked charge node 336 and second pre-drive control node 324 are pulled to VSS by the activation of transistor N344. This causes transistor P318 to be turned on. The large size of the transistors within the charge group (P318, N342, N344 and N346) allows for rapid charging of the low drive node 310, which overpowers the small devices within the second latch 312, resulting in the low drive node 310 going high. Drive transistor N302 is turned on, and the output node 304 (and hence the dqz value) is driven to VSS. In this manner the low drive node 310 is rapidly driven by the low pre-drive circuit 322 in response to a rising CLK edge and a low q data value.

The low-to-high transition at low drive node 310 is fed back to the second reset circuit 328. This results in transistor P326 being turned off and transistor N348 being turned on. The reset2 signal thus goes low, turning off transistor N346 and turning on transistor P322. With transistor N346 turned off, relatively small transistor P322 turns off the large charge transistor P318 by pulling the second pre-drive control node 324 back up to VDD. The use of the relatively small transistor P320 to turn off the relatively large transistor P320 reduces current consumption. In this manner, the second reset circuit 328 utilizes the potential at the low drive node 310 to reset the second pre-drive control node 324 to the disable (high) potential. It is noted that once transistor P318 is turned off, the only devices maintaining the low drive node 310 at the high potential are the weak devices within the second latch 312. This arrangement allows for the low drive node 310 to be rapidly discharged by a subsequent operation, as the relatively large devices of the low pre-drive circuit 322 can quickly overpower the second latch 312. Such a discharge operation would also consume relatively small amounts of current as well.

At time t4, the CLK signal transitions low, resulting in the odrv signal also going low, and the nodrv signal going high. The data values q and q_ remain low and high, respectively. Within the first disable circuit 318, transistor N330 is turned on. Within the high pre-drive circuit 314 transistors N320 and N324 are turned off, disabling the discharge group (N318 and N320) and charge group (P308, N322, N324 and N326). It is noted that once transistor N320 is turned off, the only devices maintaining the high drive node 306 at the low potential are the weak devices within the first latch 308. This arrangement allows for the high drive node 306 to be rapidly charged by a subsequent operation, as the large devices of the high pre-drive circuit 314 can quickly overpower the first latch 308. Such a charge operation would consume relatively small amounts of current.

At the same time, within the second disable circuit 326 transistor P324 is turned on. Because transistor P320 is already on, there is no substantial effect on the second pre-drive control node 324. Within the low pre-drive circuit 322, the low odrv signal turns off transistors N340 and N344, disabling the discharge group (N338 and N340) and the charge group (P318, N342, N344 and N346).

At time t5, the data value changes. The signal q goes high, resulting in the signal q_ going low. Within the first disable circuit 318 transistor N328 is turned off. However, because transistor N330 remains on, there is no substantial change in the status of the trigger node 332. Within the high pre-drive circuit 314 transistor N318 is turned off, and transistor N322 is turned on. This action switches the standing of the charge group (P308, N322, N324 and N326) and discharge group (N318 and N320). As a result, a subsequent high CLK signal will result in the activation of the charge group, while the discharge group will remain disabled. The change in data values has a similar effect within the low pre-drive circuit 322, with transistor N338 turning on, and transistor N342 turning off. Thus, on a subsequent high CLK signal, the discharge group would be activated while the charge group remains disabled.

Within the second disable circuit 326 transistor P320 is turned on. However, because transistors P322 and P324 are already on, there is no substantial change in the second pre-drive control node 324.

At time t6 the CLK signal transitions high once again. In response, the odrv signal returns high and the nodrv signal returns low. Within the first disable circuit 318 transistor N330 is turned off. With q_low, transistor N328 is also off, and the only device maintaining the trigger node 332 at the low potential, is the small transistor N332 within the feedback inverter (P312/N332). At the same time, within the high pre-drive circuit 314, the charge group (P308, N322, N324 and N326) is enabled. The high-going odrv signal turns on transistor N324. Due to the high q value and high reset1 signal, the first pre-drive control node 316 is pulled to VSS. Within the feedback inverter, transistor N332 is turned off, and transistor P312 is turned on, pulling the trigger node 332 to VDD, and disabling transistor P310. It is noted that the large devices of the charge group (P308, N322, N324 and N326) quickly overpower the small devices of the first disable circuit 318, providing for rapid and lower power switching.

As the first pre-drive control node 316 is driven to VSS, transistor P308 is turned on. Because transistor P308 is a relatively large device, the first latch 308 is overpowered, and the high drive node 306 is rapidly pulled to VDD. This new value is then latched within the first latch 308. Drive transistor N300 is turned on, and the output node 304 (and hence the dqz value) is driven to VDD. In this manner the high drive node 306 is rapidly driven by the high pre-drive circuit 314 in response to a rising CLK edge and a high q data value.

The low-to-high transition at high drive node 306 is fed back to the first reset circuit 320. This results in transistor P314 being turned off and transistor N334 being turned on. The reset1 signal is driven low, turning off transistor N326 within the high pre-drive circuit 314, and disabling the charge group (P308, N322, N324 and N326).

It is noted that the high odrv signal also turns on transistor N320 within the high pre-drive circuit 314, pulling the first clocked discharge node 330 to VSS. However, because q_ remains low, transistor N318 remains turned off and the discharge group (N318 and N320) remains disabled.

Also at time t6, the low pre-drive circuit 322 is enabled in a complementary fashion. The high odrv signal turns on transistor N340 of the discharge group (N338 and N340). Because transistor N338 was already turned on, the second latch 312 is quickly overpowered. and the second clocked discharge node 334 and low drive node 310 are rapidly discharged. Drive transistor N302 is then turned off. It is noted that the discharge action of the low pre-drive circuit 322 is more rapid than the charge action of the high pre-drive circuit 314 described above, therefore, transistor N302 is turned off before transistor N300 is turned on.

The same high transition of the odrv signal at time t6 turns off transistor P324 of the second disable circuit 326, and turns on transistor N344 within the low pre-drive circuit 322. However, because the q_ signal is low, transistor P320 remains on, keeping the second pre-drive control node 324 at a high potential.

The newly established low potential at the low drive node 310 is fed back to the second reset circuit 328. Transistor P326 is turned on and transistor N348 is turned off. This drives the reset2 signal high, turning on transistor N346. Because transistor N344 is already on, the clocked charge node 336 is pulled to VSS. However, because the q_ signal is low, transistor N342 keeps the charge group (P318, N342, N344 and N346) disabled.

At time t7, the CLK signal returns low, driving the odrv signal low and the nodrv signal high. Within the first disable circuit 318, transistor N330 is turned on. Because transistor N330 is larger than the very small devices of feedback inverter P312/N332, the trigger node 332 is pulled to VSS. Transistor P310 is turned on, and pulls the first pre-drive control node 316 to VDD. Feedback inverter P312/N332 is overpowered, and latches the high level at node 316. With node 316 at VDD, the large drive transistor P308 is turned off. The use of the relatively small transistor P310 to turn off of the relatively large transistor P308 reduces current consumption.

In this manner, the first disable circuit 318 utilizes the low portion of the CLK cycle, to reset the first pre-drive control node 316 to the disable (high) potential. It is noted that once transistor P308 is turned off, the only devices maintaining the high drive node 306 at the high potential are the weak devices within the first latch 308. This arrangement allows for the high drive node 306 to be rapidly discharged by a subsequent operation because the relatively large devices of the high pre-drive circuit 314 can quickly overpower the small devices of the first latch 308.

Also at time t7, transistors N324 and N320 are turned off. Similarly, within the low pre-drive circuit, transistor N344 and N340 are turned off. Transistor P320 within the second disable circuit remains turned on, thus the state of the second pre-drive control node 324 is not changed.

At time t8, the data value changes once again, with q value going low and the q_ value going high. Transistor N328 within the first disable circuit 318 is turned on. However, due to transistor N330, the trigger node 332 is already at VSS and is not affected. Within the high pre-drive circuit 314, the standing of the charge group (P308, N322, N324 and N326) and discharge group (N318 and N320) switches, with transistor N322 turning off and transistor N318 turning on. Thus, a subsequent high CLK signal, will activate the discharge group and not the charge group. The turning on of transistor N318 couples the first clocked discharge node 330 to the high drive node 306, pulling it high.

In a similar fashion to the high pre-drive circuit 314, within the low pre-drive circuit 322, the change in q and q_ values causes the standing of the charge group (P318, N342, N344 and N346) and discharge group (N338 and N340) to switch. Transistor N342 is turned on, coupling the clocked charge node 336 to the second pre-drive control node 324, and pulling it high. Transistor N338 is turned off. Thus, a subsequent high CLK signal, will activate the charge group and not the discharge group.

At the same time, transistor P320 within the second disable circuit 326 is turned off. However, because the odrv signal is low, transistor P324 remains on, maintaining the second pre-drive control node 324 at VDD.

At time t9, the CLK signal goes high, initiating a third output data cycle. The odrv signal goes high, and is inverted by the circuit of FIG. 2A to generate the nodrv signal. The high odrv signal turns on transistor N320 coupling the first clocked discharge node 330 and the high drive node 306 to VSS. First latch 308 is overpowered, and latches the new, low voltage at the high drive node 306. In addition, drive transistor N300 is turned off. The low potential at the high drive node 306 is fed back to the first reset circuit 320. Transistor P314 is turned on and transistor N334 is turned off. The reset1 signal is driven high, turning on transistor N326 within the high pre-drive circuit 314. However, due to the low q value, transistor N322 is turned off, keeping the charge group (P308, N322, N324 and N326) disabled.

The low nodrv signal turns off transistor N330. However, the high q_ value keeps the trigger node 332 low. This, in turn, keeps transistor P310 turned on, maintaining the first pre-drive control node 316 at the disable potential.

Within the low pre-drive circuit 322, the high odrv value at time t9 turns on transistor N340. However, due to the low q value, transistor N338 is off, and the discharge group (N338 and N340) is disabled. At the same time, the charge group (P318, N342, N344 and N346) is enabled. Transistor N344 turns on and transistor P322 turns off, pulling the second pre-drive control node 324 and clocked charge node 336 to VSS. This turns on transistor P318, resulting in the second latch 312 being overpowered, and the low drive node 310 being pulled high. The state of the low drive node 310 is latched by the second latch 312. Drive transistor N302 is turned on, and the output node (and dqz) are driven to VSS.

The high potential at the low drive node 310 is fed back to the second reset circuit 328. Within the second reset circuit 328 transistor N348 is turned on, and transistor P326 is turned off. The reset2 signal is driven low, turning off transistor N346 within the low pre-drive circuit 322. At the same time, the low reset2 signal turns on transistor P322 within the second disable circuit 326. When transistor P322 turns on, the second pre-drive control node 324 is pulled to VDD, turning off transistor P318.

At time t10 the CLK signal, and hence the odrv signal go low. The preferred embodiment 300 responds in the same general fashion as described in conjunction with time t4.

At time t11 the OE signal goes low, placing the preferred embodiment 300 in a disabled state once again. As OE goes low, the hiz signal follows, by going high. Within the first disable circuit 318, transistor N327 is turned on. However, due to the nodrv and q_ values, transistors N330 and N328 are already on, maintaining the first pre-drive control node 316 at the disable (high) potential. At the same time, the hiz signal is applied to the first reset circuit 320, turning transistor P316 off and transistor N336 on. The reset1 signal is driven low, turning off transistor N326.

The hiz signal is also applied to the second reset circuit 328, resulting in transistor P328 being turned off, and transistor N350 being turned on. However, due to the high potential of the low drive node 310, the reset2 signal is already low.

At time t12, the high-going hiz signal propagates through the circuit of FIG. 2B, causing the dhiz signal to transition high. Transistor N310 is turned on further coupling the high drive node 306 to VSS. At the same time, transistor N312 is turned on, and due to its large size, the second latch 312 is overpowered, and the low drive node 310 is pulled to VSS. This value is then latched by the second latch 312. Drive transistor N302 is thus turned off. With transistors N300 and N302 off, the output node 304 is placed in the high impedance state. The low potential at the low drive node 310 is fed back to the second reset circuit 328. Within the second reset circuit 328 transistor P326 is turned on, and transistor N348 is turned off.

It is noted that while the preferred embodiment has been described as utilizing an "NMOS" output driver (both the hi side and the lo side consisting of N-channel devices), the preferred embodiment of this output buffer could also be described using a "CMOS" output driver (P-channel for the hi side and N-channel for the lo side with appropriate changes to the pre-driver circuitry understood to be obvious to one skilled in the art.

It is noted that while the preferred embodiment has been described as being applicable to synchronous RAMs, the preferred embodiment output buffer described could be used in other semiconductor devices that require rapid, low power, synchronous data output signals.

It is further noted that the particular circuit of FIG. 3 represents just one embodiment of the present invention. Therefore, it is understood that while the present invention has been described in terms of detailed preferred embodiments, various changes, substitutions, and alterations could be made without departing from the spirit and scope of the invention. Accordingly, the present invention is intended to be limited only as defined by the appended claims.

What is claimed is:

1. In a synchronous semiconductor device that receives a system clock signal, an output buffer comprising:
   an output node;
   a first drive device that couples the output node to a first logic voltage in response to the potential at a first drive node;
   a second drive device that couples the output to a second logic voltage in response to the potential at a second drive node; and
   a first pre-drive circuit coupled to the first drive node, the first pre-drive circuit including,
      a first charge device having a first charge path and a first pre-drive node, the first charge device coupling the first drive node to a charge potential when the first pre-drive node is at an enable potential and providing a high impedance path between the first drive node and the charge potential when the first pre-drive node is at a disable potential, and
      at least one first enable device having a first enable path coupled between the first pre-drive node and an enable potential, the first enable device providing a low impedance first enable path when the system clock signal is at a first clock level, and a high impedance first enable path when the system clock signal is at a second clock level; and
   at least one first disable device having a first disable path coupled between the first pre-drive node and a disable potential, the first disable device providing a low impedance first disable path when the system clock signal is at the second clock level, and a high impedance first disable path when the system clock signal is at the first clock level.

2. The output buffer of claim 1, wherein:
   the first disable device is substantially smaller than the first charge device.

3. The output buffer of claim 1, wherein:
   the first drive device includes an insulated gate field effect transistor (IGFET) having a source-drain path coupled between the output node and the first logic voltage, and a gate coupled to the first drive node; and
   the second drive device includes an IGFET having a source-drain path coupled between the output node and the second logic voltage, and a gate coupled to the second drive node.

4. The output buffer of claim 3, wherein:
   the IGFETs of the first drive device and second drive are n-channel IGFETs.

5. The output buffer of claim 1, wherein:
   the first charge device includes a p-channel IGFET having a gate coupled to the first pre-drive node,
   the at least one first enable device includes an n-channel IGFET, and the first enable path includes the source-drain path of the n-channel IGFET, and
   the at least one first disable device includes a p-channel IGFET, and the first disable path includes the source-drain path of the p-channel IGFET.

6. The output buffer of claim 1, wherein:
the first pre-drive circuit further includes
  a first clocked discharge device having a first discharge path coupled between the first drive node and a discharge potential, the first clocked discharge device providing a low impedance first discharge path when the system clock level is at the first clock level.

7. The output buffer of claim 6, wherein:
the first pre-drive circuit further includes
  a first data activated device having a first data activated path arranged in series with the first enable path between the first pre-drive node and the enable potential, the first data activated device providing a low impedance first data activated path when an input data value is at one data logic value, and
  a second data activated device having a second data activated path arranged in series with the first discharge path between the first drive node and the discharge potential, the second data activated device providing a low impedance second data activated path when the input data value is at another data logic value.

8. The output buffer of claim 1, further including:
a second pre-drive circuit coupled to the second drive node, the second pre-drive circuit including,
  a second charge device having a second charge path and a second pre-drive node, the second charge device coupling the second drive node to the charge potential when the second pre-drive node is at the enable potential and providing a high impedance path between the second drive node and the charge potential when the second pre-drive node is at the disable potential, and
  at least one second enable device having a second enable path coupled between the second pre-drive node and the enable potential, the second enable device providing a low impedance second enable path when the system clock signal is at the first clock level, and a high impedance second enable path when the system clock signal is at the second clock level; and
at least one second disable device having a second disable path coupled between the second pre-drive node and the disable potential, the second disable device providing a low impedance second disable path when the system clock signal is at the second clock level, and a high impedance second disable path when the system clock signal is at the first clock level.

9. The output buffer of claim 8, wherein:
the second disable device is substantially smaller than the second charge device.

10. The output buffer of claim 7, wherein:
the second charge device includes a p-channel IGFET having a gate coupled to the second pre-drive node,
the at least one second enable device includes an n-channel IGFET, and the second enable path includes the source-drain path of the n-channel IGFET, and
the at least one second disable device includes a p-channel IGFET, and the second disable path includes the source-drain path of the p-channel IGFET.

11. The output buffer of claim 1, wherein:
the first pre-drive circuit further includes a reset device having a reset path coupled in series with the first enable path between the first pre-drive node and an enable potential, the reset device providing a low impedance reset path when the first drive node is at one potential, and a high impedance reset path when the first drive node is at another potential.

12. An output buffer that provides an output signal at an output node in response to a data signal and a periodic clock signal, the output buffer comprising:
  a first drive transistor having a control gate, and a source-drain path coupled between a first drive voltage and an output node;
  a second drive transistor having a control gate, and a source-drain path coupled between a second drive voltage and the output node;
  a first pre-drive circuit having
    a first discharge group of transistors that provide a discharge path between the control gate of the first drive transistor and a discharge potential,
  a first charge group of transistors including
    a first charge transistor having a source-drain path coupled between the control gate of the first drive transistor and a charge potential, and
    a first charge enable transistor having a source-drain path coupled between the gate of the first charge transistor and an enable potential, the first charge enable transistor being activated in synchronism with the clock signal;
    a first disable transistor having a source-drain path coupled between the gate of the first charge transistor and a disable potential, the first disable transistor being activated in synchronism with the clock signal;
  a second pre-drive circuit having
    a second discharge group of transistors that provides a discharge path between the control gate of the second drive transistor and the discharge potential,
  a second charge group of transistors including
    a second charge transistor having a source-drain path coupled between the control gate of the second drive transistor and the charge potential, and
    a second charge enable transistor having a source-drain path coupled between the gate of the second charge transistor and the enable potential, the second charge enable transistor being activated in synchronism with the clock signal; and
    a second disable transistor having a source-drain path coupled between the gate of the second charge transistor and a disable potential, the second disable transistor being activated in synchronism with the clock signal.

13. The semiconductor memory device of claim 12, wherein:
the first disable device has a channel width that is substantially smaller than that of the first charge enable transistor.

14. The semiconductor memory device of claim 12, wherein:
the second disable device has a channel width that is substantially smaller than that of the second charge enable transistor.

15. The semiconductor memory device of claim 12, wherein:
the first discharge group of transistors includes a first clocked discharge transistor having a source-drain path coupled between the control gate of the first drive transistor and the discharge potential, the first clocked discharge transistor being activated in synchronism with the clock signal.

16. The semiconductor memory device of claim 15, wherein:

the first clocked discharge transistor has a channel width that is substantially greater than that of the first disable transistor.

17. The semiconductor memory device of claim 15, wherein:
the first discharge group of transistors further includes a first data discharge transistor having a source-drain path coupled between the control gate of the first drive transistor and the discharge potential, the first data discharge transistor being activated in response to the data signal.

18. The semiconductor memory device of claim 17, wherein:
the first data discharge transistor has a channel width that is substantially greater than that of the first disable transistor.

19. The semiconductor memory device of claim 12, wherein:
the first charge group of transistors further includes a first data enable transistor having a source-drain path coupled between the gate of the first charge transistor and the enable potential, the first data enable transistor being activated in response to the data signal.

20. The semiconductor memory device of claim 12, wherein:
the first data enable transistor has a channel width that is substantially greater than that of the first disable transistor.

21. The semiconductor memory device of claim 12, wherein:
the second discharge group of transistors includes a second clocked discharge transistor having a source-drain path coupled between the control gate of the second drive transistor and the discharge potential, the second clocked discharge transistor being activated in synchronism with the clock signal.

22. The semiconductor memory device of claim 21, wherein:
the second discharge transistor has a channel width that is substantially greater than that of the second disable transistor.

23. The semiconductor memory device of claim 22, wherein:
the second discharge group of transistors further includes a second data discharge transistor having a source-drain path coupled between the control gate of the second drive transistor and the discharge potential, the second data discharge transistor being activated in response to the data signal.

24. The semiconductor memory device of claim 23, wherein:
the second data discharge transistor has a channel width that is substantially greater than that of the second disable transistor.

25. The semiconductor memory device of claim 12, wherein:
the second charge group of transistors further includes a second data enable transistor having a source-drain path coupled between the gate of the second charge transistor and the enable potential, the second data enable transistor being activated in response to the data signal.

26. The semiconductor memory device of claim 25, wherein:
the second data enable transistor has a channel width that is substantially greater than that of the second disable transistor.

27. An output buffer for a synchronous semiconductor memory device, comprising:
a high drive node;
a low drive node;
a high pre-drive circuit coupled to the high drive node, the high pre-drive circuit including
a first charge path that includes
a high node charge transistor having a source-drain path coupled between the high drive node and a charge potential, and
a plurality of high node charge enable transistors arranged in series between the gate of the high node charge transistor and an enable potential, a first high node charge enable transistor being activated by a system clock signal, and
a first discharge path that includes a plurality of high node discharge transistors having source-drain paths arranged in series between the high drive node and a discharge potential;
a first disable circuit that includes a first disable transistor having a source-drain path coupled between the gate of the high node charge transistor and a disable potential, the first disable transistor being activated by the system cock signal;
a low pre-drive circuit coupled to the low drive node, the low pre-drive circuit including
a second charge path that includes
a low node charge transistor having a source-drain path coupled between the low drive node and a charge potential, and
a plurality of low node charge enable transistors arranged in series between the gate of the low node charge transistor and the enable potential, a first low node charge enable transistor being activated by the system clock signal, a second discharge path that includes a plurality of low node discharge transistors having source-drain paths arranged in series between the low drive node and a discharge potential; and
a second disable circuit that includes a second disable transistor having a source-drain path coupled between the gate of the low node charge transistor and the disable potential, the second disable transistor being activated by the system clock signal.

28. The output buffer of claim 27, wherein:
when turned on, the transistors within the first charge path can pass substantially more current than the transistors of the first disable circuit; and
when turned on, the transistors within the second charge path can pass substantially more current than the transistors of the second disable circuit.

29. The output buffer of claim 27, wherein:
the high node charge enable transistors further include a second high node charge enable transistor that is activated by a data signal; and
the low node charge enable transistors further include a second low node charge enable transistor that is activated by the data signal.

30. The output buffer of claim 27, wherein:
the high node charge enable transistors further include a first reset charge enable transistor that is activated by the potential of the high drive node; and
the low node charge enable transistors further include a second reset charge enable transistor that is activated by the potential of the low drive node.

31. The output buffer of claim 30, wherein:

the high drive node is coupled to the first reset charge enable transistor by a logic NOR gate that also receives a disable signal; and the low drive node is coupled to the second reset charge enable transistor by a logic NOR gate that also receives the disable signal.

32. The output buffer of claim 27, further including:

a first latch coupled to the high drive node, the first latch including cross-coupled first latch transistors; and a second latch coupled to the low drive node, the second latch including cross-coupled second latch transistors; wherein when turned on, the transistors within the first charge path can pass substantially more current than the transistors of the first latch circuit; and when turned on, the transistors within the second charge path can pass substantially more current than the transistors of the second latch circuit.

* * * * *